United States Patent
Chang

(10) Patent No.: US 10,001,698 B2
(45) Date of Patent: Jun. 19, 2018

(54) LAYOUT HIERACHICAL STRUCTURE DEFINED IN POLAR COORDINATE

(71) Applicant: Taiwan Semiconductor Manufacturing Company, Ltd., Hsin-Chu (TW)

(72) Inventor: Shih-Ming Chang, Hsinchu County (TW)

(73) Assignee: TAIWAN SEMICONDUCTOR MANUFACTURING COMPANY, LTD, Hsin-Chu (TW)

( * ) Notice: Subject to any disclaimer, the term of this patent is extended or adjusted under 35 U.S.C. 154(b) by 0 days. days.

(21) Appl. No.: 14/969,182

(22) Filed: Dec. 15, 2015

(65) Prior Publication Data

US 2017/0168385 A1    Jun. 15, 2017

(51) Int. Cl.
*G06F 17/50* (2006.01)
*G03F 1/36* (2012.01)

(52) U.S. Cl.
CPC ............ *G03F 1/36* (2013.01); *G06F 17/5072* (2013.01)

(58) Field of Classification Search
CPC ............................... G03F 1/36; G06F 17/5072
See application file for complete search history.

(56) References Cited

U.S. PATENT DOCUMENTS

| | | | |
|---|---|---|---|
| 4,654,805 A * | 3/1987 | Shoup, II | G06F 3/13 358/1.3 |
| 5,798,937 A * | 8/1998 | Bracha | G06F 17/5068 257/774 |
| 5,949,986 A * | 9/1999 | Riley | G01R 31/2853 324/210 |
| 7,346,878 B1 * | 3/2008 | Cohen | G06F 17/5068 716/55 |
| 8,421,205 B2 | 4/2013 | Yang | |
| 8,464,186 B2 | 6/2013 | Wang et al. | |
| 8,468,473 B1 | 6/2013 | Wang et al. | |
| 8,473,877 B2 | 6/2013 | Wang et al. | |
| 8,507,159 B2 | 8/2013 | Wang et al. | |
| 8,510,687 B1 | 8/2013 | Liu et al. | |
| 8,524,427 B2 | 9/2013 | Shin et al. | |
| 8,530,121 B2 | 9/2013 | Wang et al. | |
| 8,563,224 B1 | 10/2013 | Chen et al. | |
| 8,584,057 B2 | 11/2013 | Liu et al. | |
| 8,601,407 B2 | 12/2013 | Wang et al. | |
| 8,609,308 B1 | 12/2013 | Chen et al. | |
| 8,627,241 B2 | 1/2014 | Wang et al. | |
| 8,661,389 B2 | 3/2014 | Chern et al. | |
| 8,677,511 B2 | 3/2014 | Wang et al. | |
| 8,698,205 B2 | 4/2014 | Tzeng et al. | |
| 8,762,900 B2 | 6/2014 | Shin et al. | |
| 8,822,106 B2 | 9/2014 | Wang et al. | |

(Continued)

*Primary Examiner* — Vuthe Siek
*Assistant Examiner* — Aric Lin
(74) *Attorney, Agent, or Firm* — Haynes and Boone, LLP

(57) ABSTRACT

The present disclosure provides one embodiment of an IC method that includes receiving an IC design layout including a first main feature and a second main feature; determining that the first main feature includes has a curvilinear-based shaped; determining that the second main feature has a polygon-based shape; and mapping a first portion of the IC design layout that includes the first main feature onto a polar coordinate and mapping a second portion of the IC design layout that includes the second main feature on onto a Cartesian coordinate.

20 Claims, 11 Drawing Sheets

(56) References Cited

U.S. PATENT DOCUMENTS

| | | |
|---|---|---|
| 8,826,212 B2 | 9/2014 | Yeh et al. |
| 8,828,632 B2 | 9/2014 | Wang et al. |
| 8,835,082 B2 | 9/2014 | Chen et al. |
| 8,836,141 B2 | 9/2014 | Chi et al. |
| 8,841,049 B2 | 9/2014 | Wang et al. |
| 8,846,278 B2 | 9/2014 | Shin et al. |
| 2002/0062206 A1* | 5/2002 | Liebchen ................ G03F 7/705 703/6 |
| 2002/0144230 A1* | 10/2002 | Rittman .............. G06F 17/5081 716/52 |
| 2003/0009736 A1* | 1/2003 | Suto .................... G06F 17/5077 716/130 |
| 2009/0023080 A1* | 1/2009 | Shim ........................ G03F 1/36 430/5 |
| 2009/0070732 A1* | 3/2009 | Sahouria .................. G03F 1/36 716/55 |
| 2010/0293516 A1* | 11/2010 | Tan .......................... G03F 1/36 716/53 |
| 2011/0313748 A1* | 12/2011 | Li ....................... G06F 17/5045 703/14 |
| 2012/0005635 A1* | 1/2012 | Lee .......................... G03F 1/36 716/53 |
| 2013/0239071 A1* | 9/2013 | Chang ................ G03F 7/70425 716/53 |
| 2013/0239078 A1* | 9/2013 | Chu .................... G06F 17/5031 716/113 |
| 2014/0107823 A1* | 4/2014 | Huang ................ B29C 67/0059 700/98 |
| 2014/0215420 A1 | 7/2014 | Lin et al. |
| 2014/0264924 A1 | 9/2014 | Yu et al. |
| 2014/0282289 A1 | 9/2014 | Hsu et al. |
| 2014/0325466 A1 | 10/2014 | Ke et al. |

* cited by examiner

LAYOUT HIERACHICAL STRUCTURE DEFINED IN POLAR COORDINATE

BACKGROUND

The semiconductor integrated circuit (IC) industry has experienced exponential growth. Technological advances in IC design and material have produced generations of ICs where each generation has scaled down to smaller and more complex circuits than the previous generation. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. For example, improvements to the IC design layout are needed.

BRIEF DESCRIPTION OF THE DRAWINGS

Aspects of the present disclosure are best understood from the following detailed description when read in association with the accompanying figures. It is noted that, in accordance with the standard practice in the industry, various features in the drawings are not drawn to scale. In fact, the dimensions of illustrated features may be arbitrarily increased or decreased for clarity of discussion.

DETAILED DESCRIPTION

Figure 1:
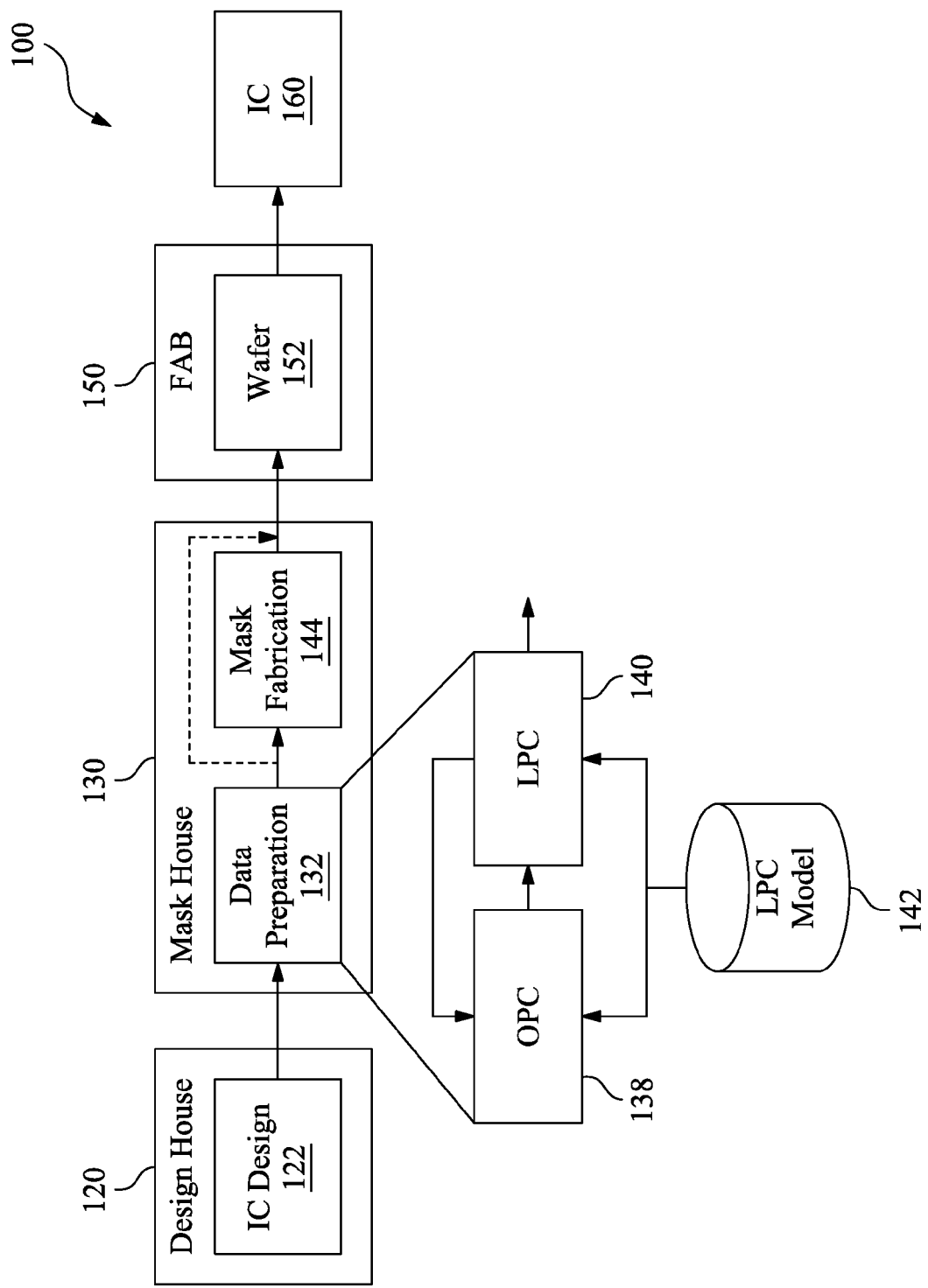
FIG. 1 shows a simplified block diagram of an embodiment of an integrated circuit (IC) manufacturing system and an associated IC manufacturing flow.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As size of a desired pattern feature on a photomask and/or a wafer decreases, developments on an integrated circuit (IC) design layout may also need to progress accordingly. Conventionally, an IC design layout is designed and constructed based on a Cartesian coordinate system. That is, each pattern on a two-dimensional layout may be decomposed into a plurality of segments extending in the x-axis and/or y-axis of the Cartesian coordinate system, more specifically, as polygons. However, in accordance with the size of the desired pattern feature being shrunk, an increasing number of the pattern features tend to deviated from a polygon-based shape. Among the variety of the pattern features on a photomask and/or a wafer, for example, a shape of a contact hole and/or a via has transitioned from the conventionally polygon-based to circle-based. Using conventional layout design based on the Cartesian coordinate system may disadvantageously increase time to form a desired feature on a photomask and/or a wafer, and thus increase cost in terms of fabricating a semiconductor device using such formed feature.

Thus, the present disclosure provides systems and methods to construct an IC design layout on a polar coordinate system. Moreover, the presently disclosed systems and methods may be adaptive in accordance with a shape of a feature on an IC design layout. As such, depending on the shape of the feature on the IC design layout, an optimal approach may be provided to form (transfer) a desired pattern feature onto a photomask and/or a wafer.

FIG. 1 is a simplified block diagram of an embodiment of an integrated circuit (IC) manufacturing system 100 and an IC manufacturing flow associated with the IC manufacturing system. The IC manufacturing system 100 includes a plurality of entities, such as a design house 120, a mask house 130, and an IC manufacturer 150 (i.e., a fab), of which interacts with one another in the design, development, and manufacturing cycles and/or services related to manufacturing an integrated circuit (IC) device 160 (i.e., a semiconductor device). The plurality of entities are connected by a communications network, which may be a single network or a variety of different networks, such as an intranet and the Internet, and may include wired and/or wireless communication channels. Each entity may interact with other entities and may provide services to and/or receive services from the other entities. The design house 120, mask house 130, and IC manufacturer 150 may be a single entity or separate entities.

The design house (or design team) 120 generates an IC design layout 122. The IC design layout 122 includes various geometrical patterns (features) designed for an IC product, based on a specification of the IC product to be manufactured. The geometrical patterns correspond to patterns of materials that make up the various components of the IC device 160 to be fabricated. For example, a portion of the IC design layout 122 includes various IC features, such as an active region, gate electrode, source and drain, metal lines and/or vias of an interlayer interconnection, and openings for bonding pads, to be formed in a semiconductor substrate (such as a silicon wafer) and/or various material layers disposed on the semiconductor substrate. The design house 120 implements a proper design procedure to form the IC design layout 122. The design procedure may include logic design, physical design, and/or place and route. The IC design layout 122 is presented in one or more data files having information about the geometrical patterns. For example, the IC design layout 122 can be expressed in a GDSII file format (or DFII file format).

The mask house 130 uses the IC design layout 122 to manufacture one or more masks to be used for fabricating the various layers of the IC product according to the IC design layout 122. The mask house 130 performs mask data preparation 132 and mask fabrication 144. Mask data preparation 132 involves the IC design layout 122 being translated into a form that can be physically written by a mask writer. Mask fabrication 144 involves using the design layout prepared by the mask data preparation 132 being modified to comply with a particular mask writer and/or mask manufacturer and then subsequently fabricating the mask. In the present embodiment, the mask data preparation 132 and mask fabrication 144 are illustrated as separate elements, however, the mask data preparation 132 and mask fabrication 144 can be considered one element that is collectively referred to as a mask data preparation element.

The mask data preparation 132 may include an optical proximity correction process (OPC) 138 and a lithography process check process (LPC) 140. The OPC 138 is a lithography enhancement technique used to compensate for image errors, such as those that can arise from diffraction, interference, and/or other process effects. OPC 138 may add features, such as scattering bars (SBs), serif, and/or hammerheads to the IC design layout 122 according to optical models and/or rules such that, after a lithography process, a final pattern on a wafer is improved with enhanced resolution and precision. The mask data preparation 132 according to an illustrated embodiment is described in greater detail below. The mask data preparation 132 also includes further resolution enhancement techniques, such as off-axis illumination, sub-resolution assist features, phase-shifting masks, other suitable techniques, and/or combinations thereof.

The LPC 140 simulates processing that will be implemented by the IC manufacturer 150 to fabricate the IC device 160. The LPC 140 simulates this processing based on the IC design layout 122 to create a simulated manufactured device, such as the IC device 160. The simulated manufactured device includes simulated contours of a portion and/or all of the IC design layout. In the present embodiment, the LPC 140 simulates processing of the modified IC design layout, which has been subjected to the OPC 138. The LPC 140 uses one or more LPC models (or rules) 142. The LPC models 142 may be based on actual processing parameters of the IC manufacturer 150. The processing parameters can include parameters associated with various processes of the IC manufacturing cycle, parameters associated with tools used for manufacturing the IC, and/or other aspects of the manufacturing process. LPC 140 takes into account various factors, such as aerial image contrast, depth of focus ("DOF"), mask error sensitivity in the form of a mask error enhancement factor ("MEEF"), other suitable factors, and/or combinations thereof.

After a simulated (or virtual) device has been created by the LPC 140, if the simulated device is not close enough in shape to satisfy design rules, certain steps in the mask data preparation 132, such as OPC 138, may be repeated to refine the IC design layout 122 further. It should be understood that the above description of the mask data preparation 132 has been simplified for the purposes of clarity, and data preparation may include additional features such as a logic operation (LOP) to modify the IC design layout according to manufacturing rules, a retarget process (RET) to modify the IC design layout to compensate for limitations in lithographic processes used by IC manufacturer 150, and a mask rule check (MRC) to modify the IC design layout to compensate for limitations during mask fabrication 144. Additionally, the processes applied to the IC design layout 122 during data preparation 132 may be executed in a variety of different orders.

During mask fabrication 144, a mask and/or a group of masks are fabricated based on the modified IC design layout. For example, an electron-beam (e-beam) and/or a mechanism of multiple e-beams is used as an exposure source to form a pattern on a mask (photomask or reticle) based on the modified IC design layout. The IC manufacturer 150 uses the mask (or masks) fabricated by the mask house 130 to transfer the IC design to a semiconductor substrate 152, such as a wafer, to form the IC device 160.

Figure 2:
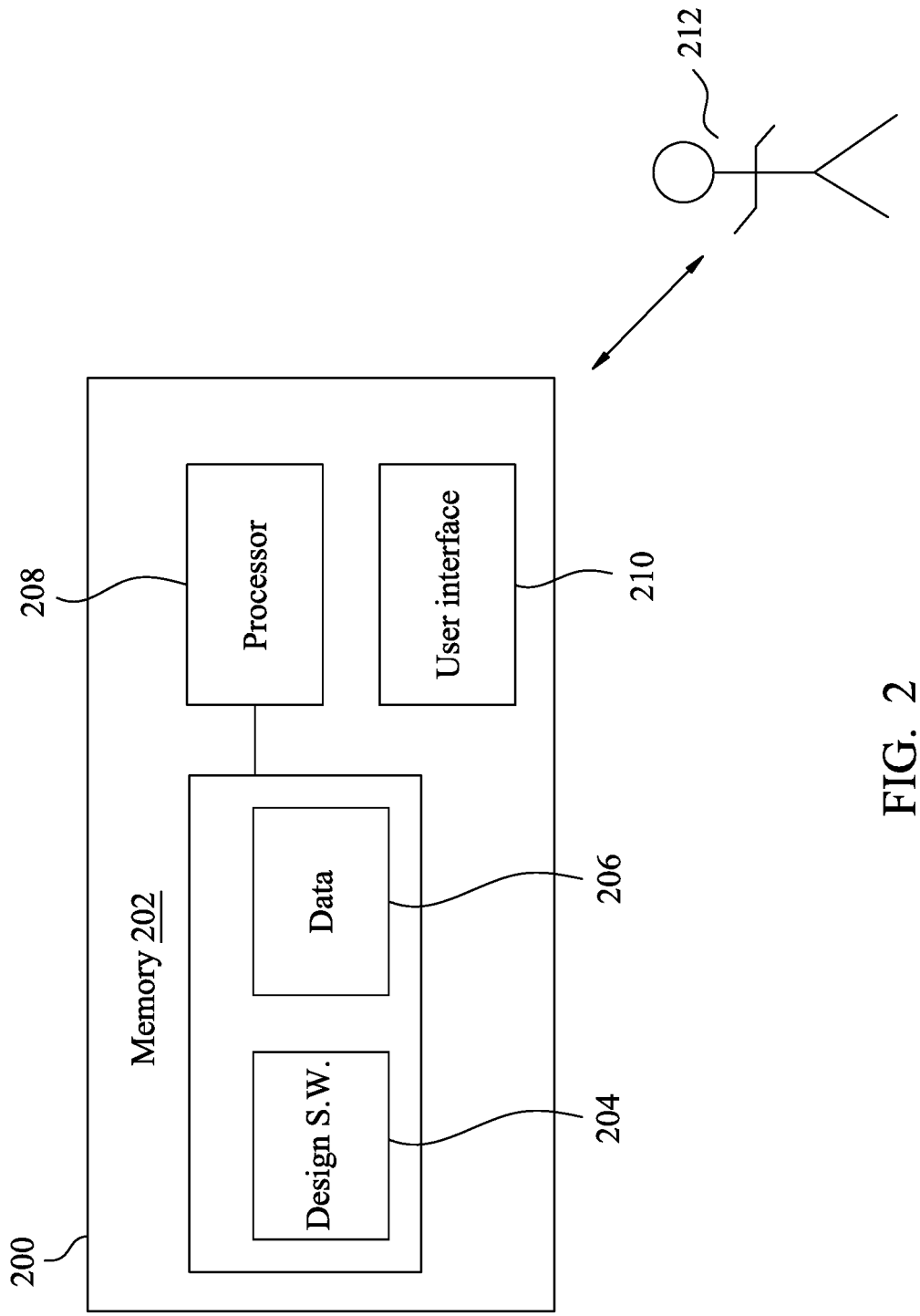
FIG. 2 shows a computing system that is implemented in accordance with some embodiments.

FIG. 2 is a diagram illustrating a computing system 200 being used to construct a design pattern (or feature) on a polar coordinate. According to certain illustrative examples, the computing system 200 includes a memory 202 having layout software 204 and data 206 stored thereon. The computing system 200 also includes a processor 208 and a user interface 210.

While still within the scope of the present disclosure, a variety of types of memory may be implemented in some embodiments. In an example, some types of memory, such as solid state drives, are configured to store. Such types of memory typically have large storage volume but relatively slow performance. Other types of memory, such as those used for Random Access Memory (RAM), are optimized for speed and are often referred to as "working memory." The various forms of memory may store information in the form of software 204 and data 206.

Referring still to FIG. 2, the processor 208 of the computing system 200 is configured to execute the software 204 and use and/or update the data 206 stored in memory 202. In a specific example, the software 204 may include layout software. In addition to storing the layout software, the memory 202 may store an operating system. An operating system allows other applications to interact properly with the hardware of the computing system 200. The layout software 204 includes the tools to receive a design pattern and modify the design pattern using OPC target points generated along a contour.

A user interface 210 may provide a means for a user 212 to interact with the system. The user 212 may use various tools such as a keyboard or a mouse to input information into the computing system 200. Additionally, various output devices such as a monitor may be used to provide information to the user 212.

Figure 3:
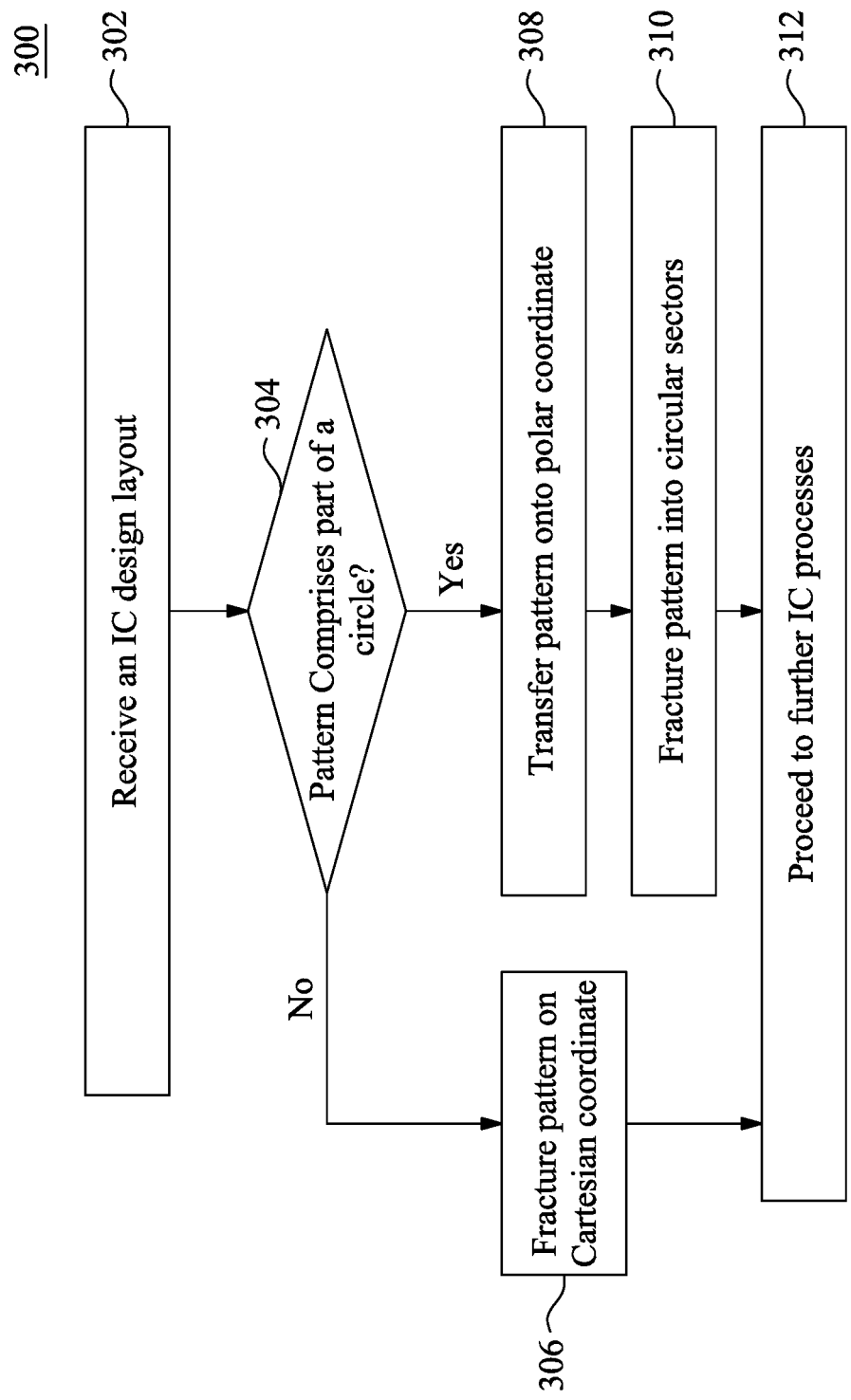
FIG. 3 shows a flowchart of an embodiment of an integrated circuit (IC) method constructed in accordance with some embodiments.

FIG. 3 is a flowchart of method 300 of constructing/generating an IC design layout according to various aspects of the present disclosure. In one embodiment, the method 300 may be implemented in the IC design 122 of design house 120 as shown in FIG. 1. In another embodiment, the method 300 may be implemented in the mask data preparation 132 of mask house 130 with respect to FIG. 1. Yet in another embodiment, the method 300 may be implemented without a presence of the mask house 130, which means that the IC design layout 122 may be directly transferred to the wafer 152 using a variety of manners such as for example, e-beam lithography. Further, the method 300 in FIG. 3 is merely an overview and, thus, details associated with each step in the method will be described in association with the subsequent figures in the present disclosure. In an embodiment discussed below, the method 300 may be used by the computing system 200. More specifically, the processor 208 may execute a plurality of instructions stored in the memory (e.g., the layout software 204) to perform each step of the method 300.

Referring to FIG. 3, the method 300 begins at step 302 with receiving an IC design layout. The IC design layout is presented in one or more data files having the information of the geometrical patterns. In one example, the IC design layout is expressed in a GDS file format. In alternative embodiments, the IC design layout may be transmitted between the components in IC manufacturing system 100 in alternate file formats such as DFII, CIF, OASIS, and/or any other suitable file type. The IC design layout includes various geometrical patterns representing features of an integrated circuit. For example, the IC design layout may include a plurality of main features such as active regions, gate electrodes, sources and drains, metal lines, interlayer interconnection vias, openings for bonding pads that may be formed in a semiconductor substrate (such as a silicon wafer) and/or various material layers disposed over the semiconductor substrate. The IC design layout may also include a background region without main features. The IC design layout may also include certain assist features, such as those features for imaging effect, processing enhancement, and/or mask identification information. Details of embodiments of the main features, assist features, etc. in accordance with using the disclosed systems and methods in the polar coordinate will be provided as follows.

In some embodiments, an optical proximity correction process (OPC) is applied to the IC design layout to compensate for distortions caused by diffraction of radiation that occurs during the use of the lithography tools. The OPC process may include applying features that will alter the photomask, such as adding sub-resolution features to the photomask that interact with the original patterns in the physical design, adding features to the original patterns such as "serifs," adding jogs to features in the original pattern, modifying main feature pattern shapes or edges, and/or other enhancements. As process nodes shrink, OPC processes and the all respects. For example, one type of advanced OPC process is inverse lithography technology (ILT). ILT includes simulating the optical lithography process in the resultant patterns become more complex. Although existing OPC processes have been generally adequate for their intended purposes, they have not been entirely satisfactory in reverse direction, using the desired pattern on the substrate as an input to the simulations. The ILT process may produce complex, non-linear patterns that can be difficult, time consuming, and/or costly to form on a photomask or reticle. For another example, another type of advanced OPC process is adding scattering bars (SBs) to the IC design layout, but doing so induces focus shifting. The present disclosure provides an OPC process that includes inserting SBs with an arrangement that reduces focus shifting in comparison to previous attempts involving the insertion of SBs.

Referring back to FIG. 3, the method 300 proceeds to step 304 with determining whether a given feature (or pattern) in the IC design layout includes a curvilinear-based shape or has a polygon-based shape. That is, the received IC layout may include one or more features (or patterns) having a curvilinear-based shape and/or one or more features (or patterns) having a polygon-based shape. By "polygon-based shape", it is meant that the geometrical pattern may be in a shape of: a rectangle, a trapezoid, a triangle, a pentagon, a hexagon, a heptagon, an octagon, a nonagon, or any variety of two-dimensional shapes with straight side(s). By "curvilinear-based shape", it is meant that the geometrical pattern is defined by one or more curved lines. By way of example, and not by limitation, a curvilinear-based shape may include shapes such as a circle, a sector (i.e., part of a circle), a circular segment, or any variety of two-dimensional shapes with curved side(s), for example, the ellipse and the oval-shaped curve.

In step 304, if the feature has a curvilinear-based shape, the method 300 proceeds to step 308 with mapping the feature to the polar coordinate system. On the other hand, if the feature is polygon-based shape, the method 300 proceeds to step 306 with fracturing the feature into sub-polygons in the Cartesian coordinate. After mapping the feature onto the polar coordinate in step 308, the method 300 continues in step 310 with fracturing the feature into sectors (or curvilinear sectors). Detailed embodiments of the fracturing pattern into sectors will be provided below with respect to FIGS. 4A-B, 5A-B, and 6A-B.

Additional steps can be provided before, during, and after the method 300, and some of the steps described can be replaced, eliminated, or moved around for additional embodiments of the method 300. After the feature is fractured into either sub-polygons in step 306 or sectors in step 310, the method 300 may proceed to further IC process stages (step 312). For example, an energized beam may use such fractured units (i.e., the sub-polygons and the circular sectors) to transfer the pattern onto a photomask and/or a wafer. In an embodiment, the method 300 stores the fractured pattern of the IC design layout as a modified layout in a tangible computer-readable medium that can be used by another IC process stage. In an embodiment, OPC is performed to the modified layout. The OPC may further modify the patterns to compensate for image errors, such as those that can arise from diffraction, interference, or other process effects. The OPC may add assist features, such as scattering bars, and/or hammerheads to the modified layout. Details of OPC will be illustrated in FIG. 5A-B.

Figure 4A:
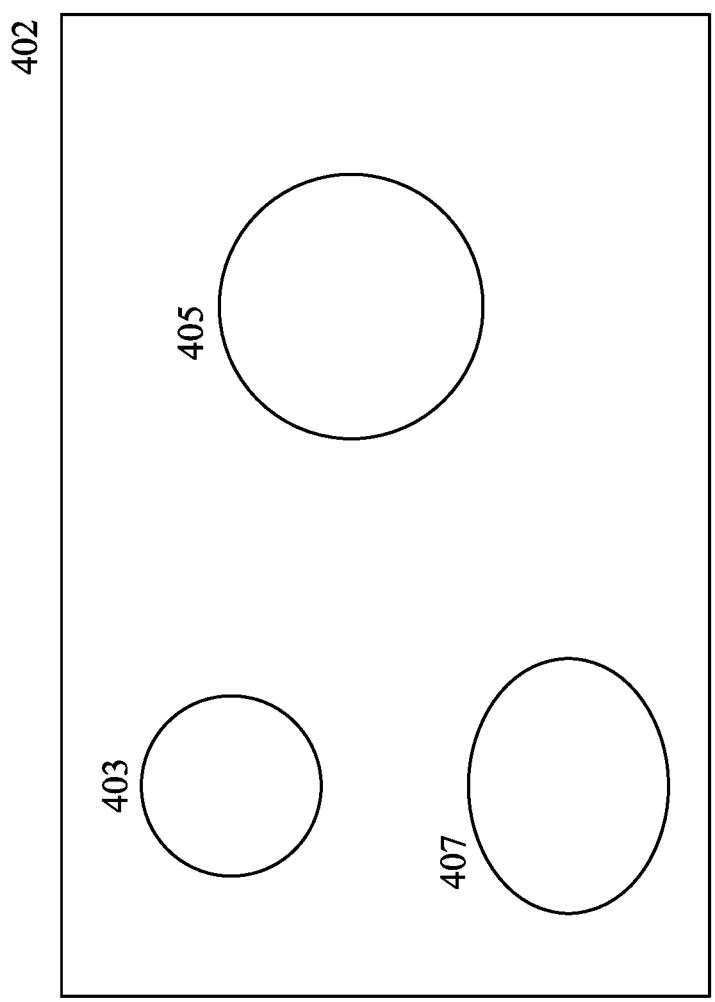
FIGS. 4A and 4B show an embodiment of an integrated circuit (IC) layout design being constructed by the method of FIG. 3 in accordance with some embodiments.
Figure 4B:
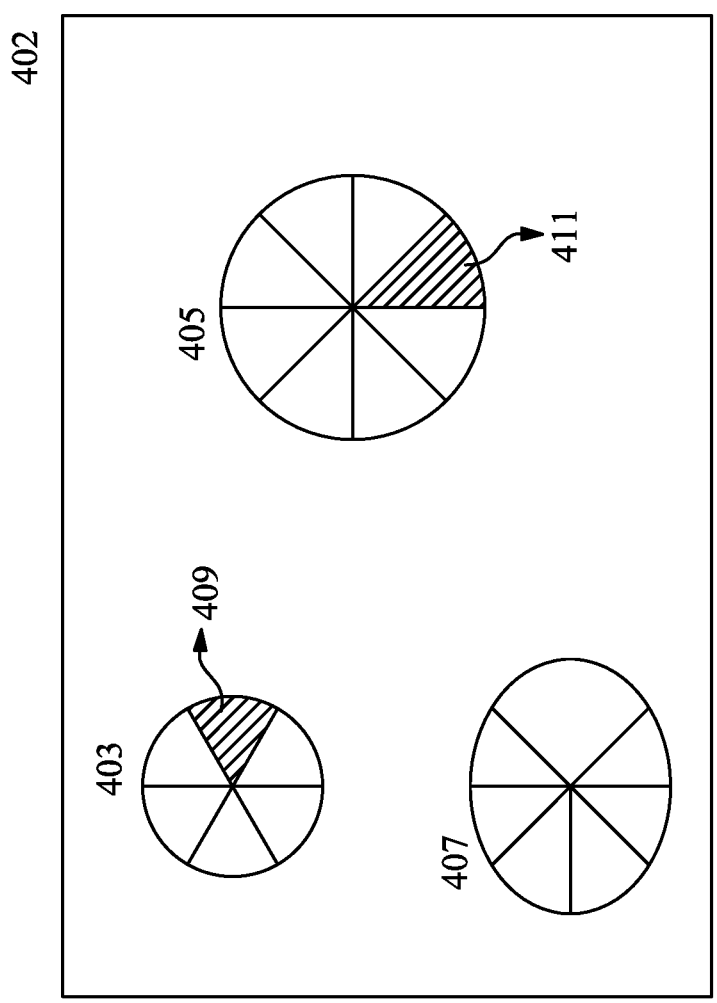

Referring to FIGS. 4A-B, in accordance with various embodiments, an IC layout design 402 may include main features (or patterns) 403, 405, and 407. As shown in the illustrative embodiment, features 403, 405, and 407 are curvilinear-based shape. The feature 403 and 405 are circular disks and feature 407 is an oval-shaped curve. Thus, according to the embodiment of step 304 in method 300, each of the features 403, 405, and 407 is mapped to polar coordinates (i.e., the step 308 of FIG. 3) and subsequently fractured into several sectors (or curvilinear sectors) in the polar coordinate (i.e., the step 310 of FIG. 3). For example, as shown in FIG. 4B, the pattern 403 is decomposed into six sectors 409 of which each sector 409 is equivalently sized. More specifically, each sector shares the same center point and radius with the pattern 403, which means that each sector is enclosed by the radius of the pattern 403 and an arc. The length of the arc may be determined by how many sectors have been decomposed. In the example of six equivalent sectors being decomposed, the length of the arc may be ⅙ of the circumference of the pattern 403.

Still referring to FIG. 4B, in some embodiments, depending on the original size of the curvilinear-based pattern, the number of how many sectors being fractured may change accordingly. For example, the pattern 405 may be fractured into eight equivalent sectors 411. Even though the illustrative embodiment shows that each of the curvilinear-based features is fractured into equivalently sized circular sectors, in some alternative embodiments, each of the curvilinear-based features may be fractured into a plurality of sectors and each of the plurality of sectors may not be equivalently sized. For example, the pattern 407 might be fractured into 7 sectors.

Figure 5A:
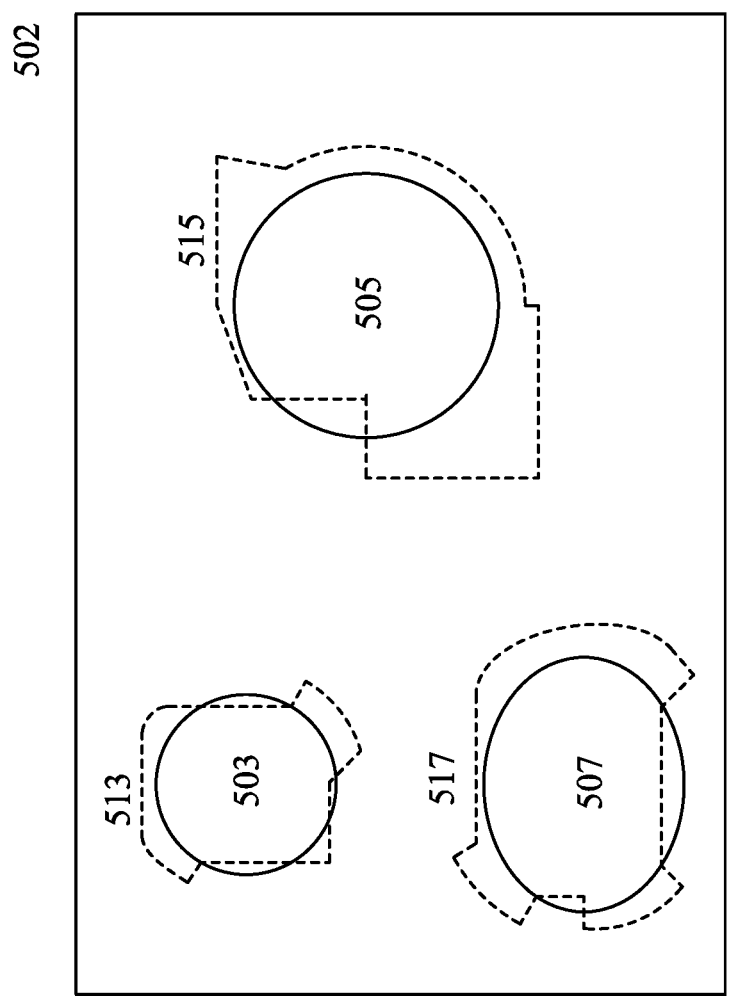
FIGS. 5A and 5B show an embodiment of an integrated circuit (IC) layout design being constructed by the method of FIG. 3 in accordance with some embodiments.
Figure 5B:
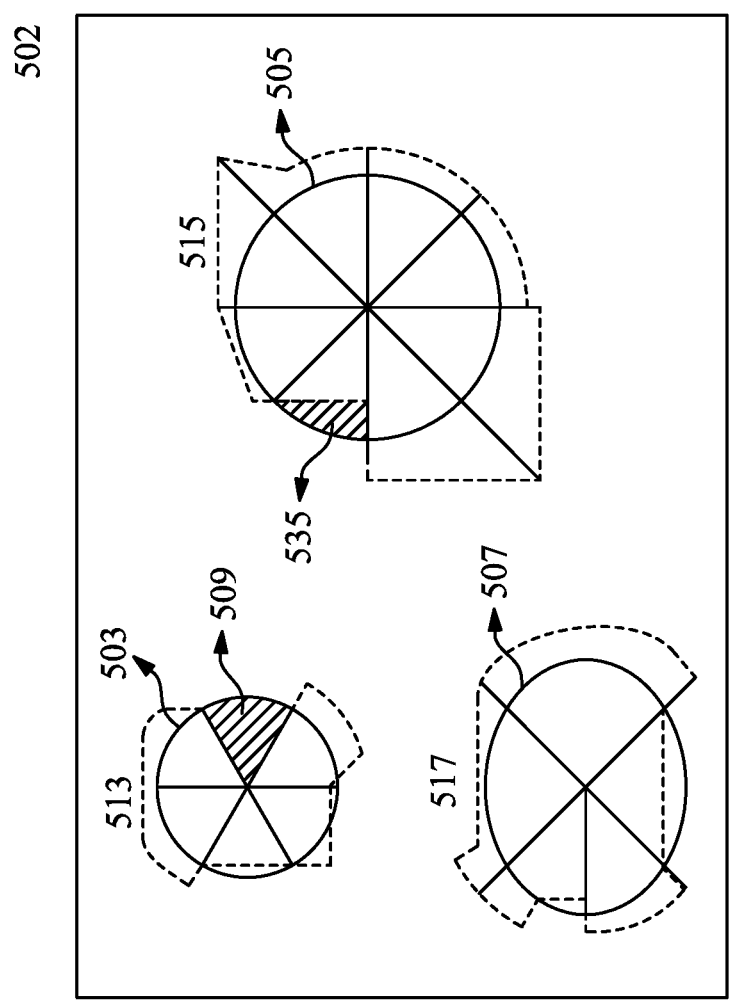

Referring to FIGS. 5A-B, an IC layout design 502 may include main features (or patterns) 503, 505, and 507. Moreover, each of the features 503, 505, and 507 may include an associated OPC target points, and in some embodiments, the OPC target points may form a contour that is different from the original shape of the associated pattern. In some embodiments, such a contour (formed by OPC target points) may enclose, or at least in part, an original pattern. For example, the feature 503 is enclosed, in part, by OPC contour 513; the feature 505 is enclosed, in part, by OPC contour 515; the feature 507 is enclosed, in part, by OPC contour 517. As shown in FIG. 5B, such OPC contours, together with the associated main/original feature, are fractured into sectors (or curvilinear sectors) on the polar coordinate once the main feature pattern and/or the OPC contour has been determined as curvilinear-based shaped feature (e.g. step 304 of FIG. 3). In an example, the features 503 and the OPC contour 513 are both fractured into six equivalently sized sectors 509. The feature 507 and the OPC contour 517 are both fractured into seven sectors. The feature 505 and the OPC contour 515 are both fractured into eight sectors.

Figure 6A:
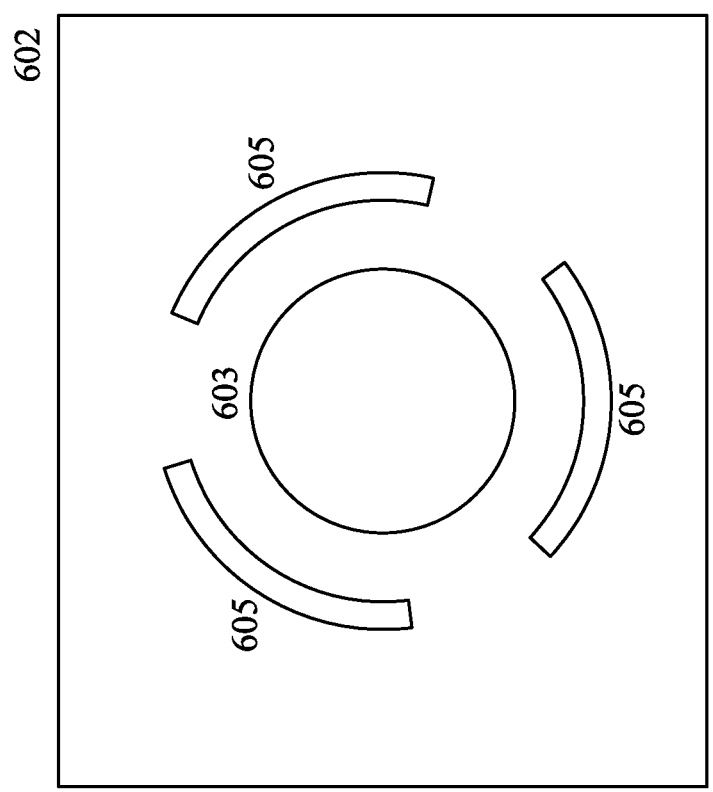
FIGS. 6A and 6B show an embodiment of an integrated circuit (IC) layout design being constructed by the method of FIG. 3 in accordance with some embodiments.
Figure 6B:
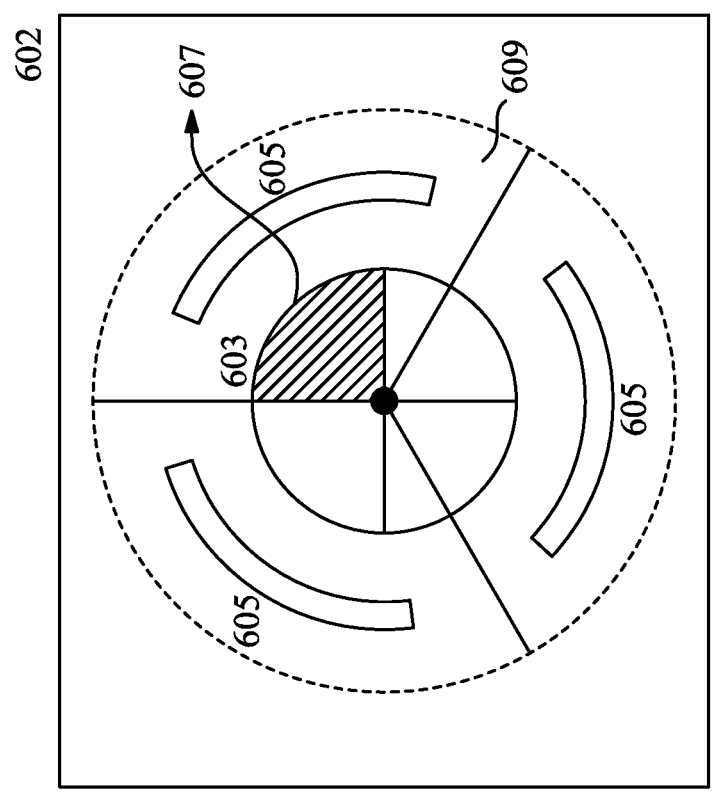

Referring to FIGS. 6A-B, an IC layout design 602 may include a main feature 603. Moreover, adjacent to the main feature 603, the layout design may further include one or more assist features (e.g., 605). According to current embodiments, as shown in FIG. 6B, such assist feature together with the associated main feature may be fractured into sectors on the polar coordinate once the main feature has been determined to have a curvilinear-based shape. In an example, the main feature 603 is fractured into four sectors and the assist feature 605 is fractured into three sectors 609.

Figure 7A:
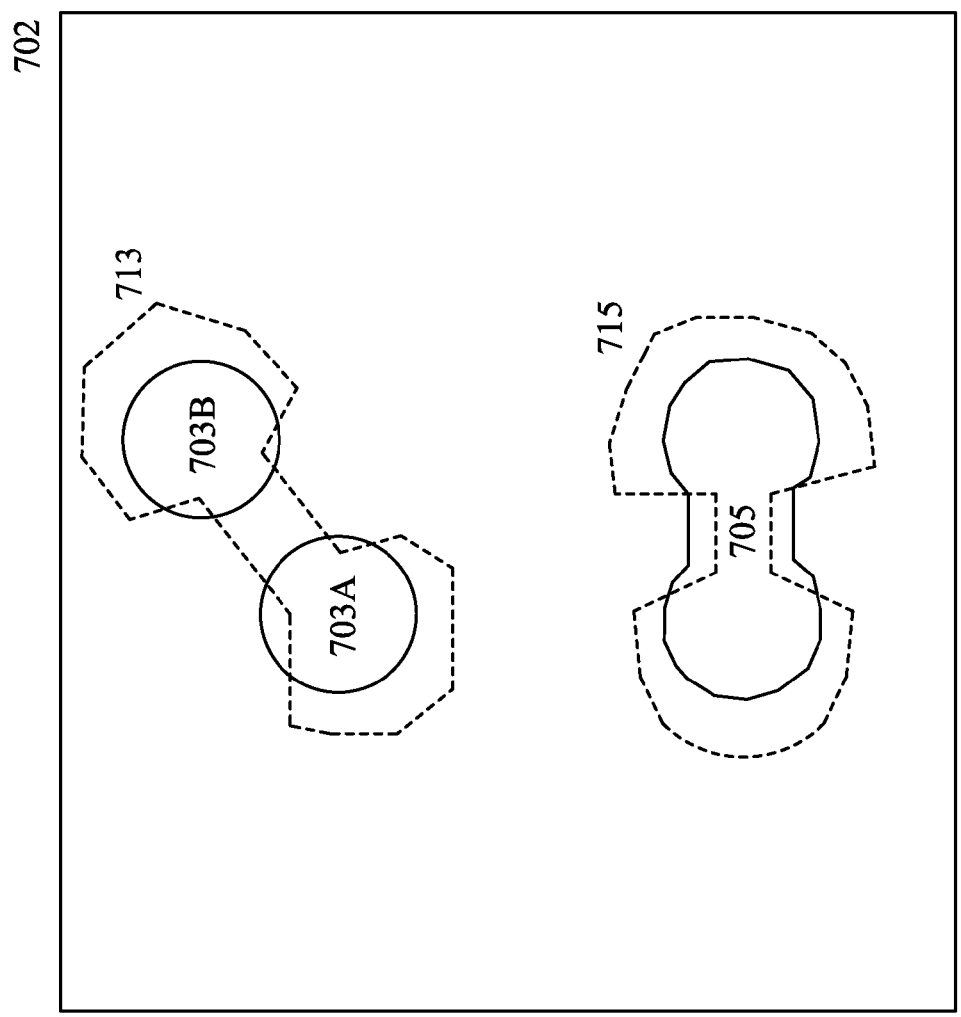
FIGS. 7A and 7B show an embodiment of an integrated circuit (IC) layout design being constructed by the method of FIG. 3 in accordance with some embodiments.
Figure 7B:
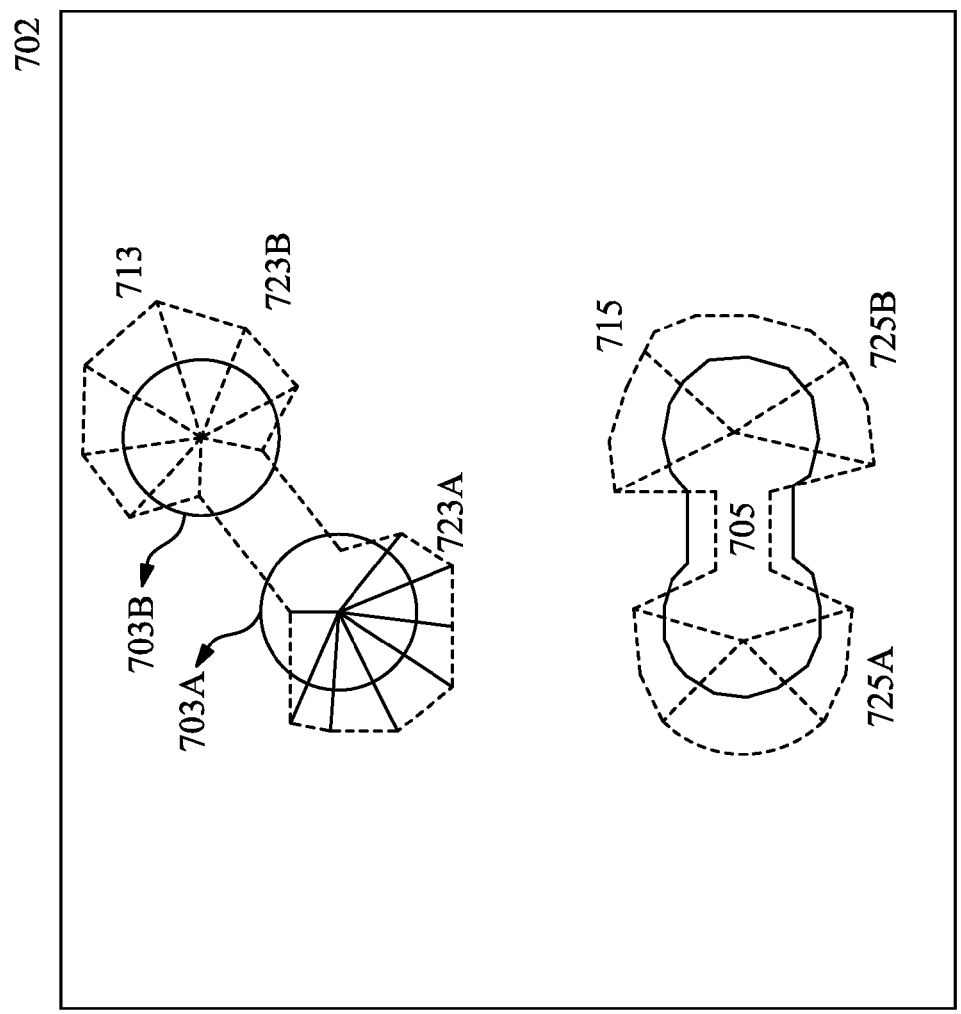

Referring to FIGS. 7A-B, an IC layout design 702 may include main features 703 and 705. The pattern 703 further comprises two pattern 703A and 703B that are substantially close to each other. The features 703 and 705 may each include an associated OPC target points, and in some embodiments, the OPC target points may form a contour that is different from the original shape of the associated pattern. For example, the feature 703 is enclosed, in part, by OPC contour 713; the feature 705 is enclosed, in part, by OPC contour 715. As shown in FIG. 7B, such OPC contours, together with the associated main feature, are fractured into sectors (or curvilinear sectors) on the polar coordinate once the main feature pattern and/or the OPC contour has been determined as curvilinear-based shaped feature (e.g. step 304 of FIG. 3). In an example, the features 703 and the OPC contour 713 are both fractured into plural sectors 723A and 723B. The feature 705 and the OPC contour 715 are fractured into plural sectors 725A and 725B.

Unlike conventional methods of constructing/generating an IC design layout where polygon and curvilinear-based shaped features are fractured together into sub-polygons in a Cartesian coordinate, the present disclosure advantageously recognizes methods of constructing/generating an IC design layout by distinguishing between polygon and curvilinear-based shaped features by fracturing polygon based features in a Cartesian coordinate and fracturing curvilinear-based shaped feature in a polar coordinate system. The advantages include at least better transferring/writing a pattern in a curvilinear shape onto a substrate, and may thus increase fidelity of such a written pattern.

The present disclosure provides a method to transfer an integrated circuit (IC) design layout. The method includes receiving an integrated circuit (IC) design layout that includes a first main feature; determining that the first main feature includes has a curvilinear-based shape; mapping the first main feature to a polar coordinate; and generating a modified design layout that includes the first main feature mapped to the polar coordinate.

The present disclosure provides a method to transfer an integrated circuit (IC) design layout. The method includes receiving an IC design layout including a first main feature and a second main feature; determining that the first main feature includes has a curvilinear-based shaped; determining that the second main feature has a polygon-based shape; and mapping a first portion of the IC design layout that includes the first main feature onto a polar coordinate and mapping a second portion of the IC design layout that includes the second main feature on onto a Cartesian coordinate.

The present disclosure provides a method to transfer an integrated circuit (IC) design layout. The method includes receiving an IC design layout including a first main feature and a second main feature; determining that the first main feature includes has a curvilinear-based shaped; determining that the second main feature has a polygon-based shape; mapping a first portion of the IC design layout that includes the first main feature onto a polar coordinate and mapping a second portion of the IC design layout that includes the second main feature on onto a Cartesian coordinate; fracturing the first main feature into a plurality of curvilinear sectors and fracturing the second main feature into a plurality of polygons; and storing the fractured curvilinear sectors and fractured polygons as a modified layout in a tangible computer-readable medium for use by a further IC process stage.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments disclosed herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for fabricating an integrated circuit (IC) device, the method comprising:
   receiving an IC design layout that includes a first main feature and a second main feature, the first main feature and the second main feature both being defined on a Cartesian coordinate, the first and second main features being mapped to a first format;
   determining that the first main feature includes at least one curvilinear-based shape, and that the second main feature does not;
   mapping the first main feature from the Cartesian coordinate to a polar coordinate;

generating a modified design layout that includes the first main feature mapped to the polar coordinate and the second main feature mapped to the Cartesian coordinate, wherein the modified design layout is different from the IC design layout;

creating a mask using the modified design layout with the first main feature mapped to the polar coordinate and the second main feature mapped to the Cartesian coordinate, wherein creating the mask using the modified design layout comprises transferring onto the mask both: (a) the first main feature or its modified version, mapped to the polar coordinate; and (b) the second main feature or its modified version, mapped to the Cartesian coordinate; and fabricating the IC device based on the mask.

2. The method of claim 1, further comprising, on the polar coordinate, fracturing the first main feature into a plurality of curvilinear sectors.

3. The method of claim 1, wherein the IC design layout further includes at least one assist feature that is adjacent the first main feature.

4. The method of claim 1, wherein the IC design layout further comprises a plurality of Optical Proximity Correction (OPC) target points adjacent the first main feature on the polar coordinate.

5. The method of claim 4, wherein the OPC target points comprise a contour having a circular shape, an ellipse shape, or an oval shape.

6. The method of claim 5, further comprising fracturing the contour into a plurality of curvilinear sectors.

7. The method of claim 1, wherein the first format is a GDS-II format.

8. The method of claim 1, wherein the first format is a DFII format.

9. A method for fabricating an integrated circuit (IC) device, the method comprising:

receiving an original IC design layout including at least one first main feature and at least one second main feature, wherein the first main feature and the second main feature are both defined on a Cartesian coordinate to represent IC components including at least one of: an active region, a gate electrode, a source, a drain, a metal line, an interlayer interconnection, an opening for bonding pads, and a material layer disposed over a semiconductor substrate;

determining that the first main feature has a curvilinear-based shape;

determining that the second main feature has a polygon-based shape;

mapping a first portion of the original IC design layout that includes the first main feature from the Cartesian coordinate onto a polar coordinate to create a modified IC design layout;

creating a first mask using the modified IC design layout which includes the first main feature on the polar coordinate and the second main feature on the Cartesian coordinate, wherein creating the first mask using the modified IC design layout comprises transferring onto the first mask both: (a) the first main feature or its modified version, mapped to the polar coordinate; and (b) the second main feature or its modified version, mapped to the Cartesian coordinate, wherein the first mask is different from a second mask that would be based on the original IC design layout; and fabricating the IC device based on the first mask.

10. The method of claim 9, further comprising fracturing the first main feature into a plurality of curvilinear sectors on the polar coordinate and fracturing the second main feature into a plurality of polygons on the Cartesian coordinate, wherein a number of the plurality of curvilinear sectors depends on an original size of the curvilinear-based shape in the first main feature.

11. The method of claim 10, wherein each of the plurality of curvilinear sectors includes at least one of: a circle, a circular sector, a circular segment, and a two-dimensional shape with a curved side.

12. The method of claim 10, wherein each of the plurality of polygons has a shape selected from the group consisting of a rectangle shape and a trapezoid shape.

13. The method of claim 10, further comprising forming a first feature on a substrate using the fractured curvilinear sectors and forming a second feature on the substrate using the fractured polygons.

14. The method of claim 9, wherein the original IC design layout further comprises a plurality of Optical Proximity Correction (OPC) target points adjacent the first main feature.

15. The method of claim 14, wherein the OPC target points form a contour in a shape of a circle or an ellipse, and wherein the method further comprises:

upon determination that the first main feature has the curvilinear-based shape, fracturing both the first main feature and the contour into a plurality of curvilinear sectors on the polar coordinate without needing to determine whether the contour has a curvilinear-based shape; and before creating the first mask, performing a lithography process check (LPC) process based on a LPC model to simulate a fabrication process for the IC device, wherein the LPC process comprises repeating an OPC step to further modify the modified IC design layout.

16. The method of claim 9, wherein the original IC design layout further includes an assist feature that is adjacent the first main feature.

17. The method of claim 16, further comprising fracturing the assist feature into a plurality of sectors on a polar coordinate.

18. A method, comprising:

receiving an IC design layout including at least one first main feature and at least one second main feature, the first main feature and the second main feature both being defined on a Cartesian coordinate;

determining that the first main feature has a curvilinear-based shaped;

determining that the second main feature has a polygon-based shape;

mapping a first portion of the IC design layout that includes the first main feature from the Cartesian coordinate onto a polar coordinate;

fracturing the first main feature into a plurality of curvilinear sectors and fracturing the second main feature into a plurality of polygons;

storing the fractured curvilinear sectors and fractured polygons as a modified layout in a tangible computer-readable medium; and creating a mask using the modified layout, wherein the modified layout includes the first main feature, represented by the fractured curvilinear sectors, on the polar coordinate and the second main feature, represented by the fractured polygons, on the Cartesian coordinate, wherein creating the mask using the modified layout comprises transferring onto the mask both: (a) the first main feature represented by the fractured curvilinear sectors or their modified version, mapped to the polar coordinate; and (b) the second main feature represented by the fractured polygons or their modified version, mapped to the Cartesian coordinate.

19. The method of claim 18, wherein each of the plurality of curvilinear sectors includes at least one of: a circle, a circular sector, a circular segment, and a two-dimensional shape with a curved side.

20. The method of claim 18, wherein each of the plurality of polygons has a shape selected from the group consisting of a rectangle shape and a trapezoid shape.

* * * * *